(12) United States Patent
Yao

(10) Patent No.: US 9,997,309 B2
(45) Date of Patent: Jun. 12, 2018

(54) TOUCH CONTROL KEYBOARD

(71) Applicant: Bing-Yang Yao, Taipei (TW)

(72) Inventor: Bing-Yang Yao, Taipei (TW)

( * ) Notice: Subject to any disclaimer, the term of this patent is extended or adjusted under 35 U.S.C. 154(b) by 0 days. days.

(21) Appl. No.: 15/581,661

(22) Filed: Apr. 28, 2017

(65) Prior Publication Data

US 2017/0316899 A1 Nov. 2, 2017

(30) Foreign Application Priority Data

Apr. 29, 2016 (TW) .............................. 105113615 A

(51) Int. Cl.
| | | |
|---|---|---|
| *H03K 17/94* | (2006.01) | |
| *H01H 13/705* | (2006.01) | |
| *H01H 1/02* | (2006.01) | |
| *H01H 13/83* | (2006.01) | |
| *H03M 11/20* | (2006.01) | |

(52) U.S. Cl.
CPC ............ *H01H 13/705* (2013.01); *H01H 1/02* (2013.01); *H01H 13/83* (2013.01); *H03M 11/20* (2013.01); *H01H 2201/028* (2013.01); *H01H 2219/028* (2013.01)

(58) Field of Classification Search
None
See application file for complete search history.

(56) References Cited

U.S. PATENT DOCUMENTS

| | | | | |
|---|---|---|---|---|
| 4,421,432 A | * | 12/1983 | Lieb ........................... | B41J 5/12 200/345 |
| 2015/0340176 A1 | * | 11/2015 | Wu ......................... | H01H 13/14 200/5 A |
| 2017/0255317 A1 | * | 9/2017 | Henty ................... | G06F 3/0416 |

\* cited by examiner

*Primary Examiner* — Adolf Dsouza

(57) ABSTRACT

A touch control keyboard includes a plurality of keycaps, a plurality of touch key parts, a plurality pairs of conductive distributions, a first circuit board, and a second circuit board. An upper part of each keycap includes a touch key part having a coupling capacitor. The touch key parts and the pair of conductive distributions and the first circuit board are electrically connected. The first circuit board detects the coupling capacitors of the touch key parts by using the pair of conductive distributions to generate a first key signal. The second circuit board detects keystrokes of the keycaps to generate a second key signal.

12 Claims, 16 Drawing Sheets

TOUCH CONTROL KEYBOARD

CROSS-REFERENCE TO RELATED APPLICATION

This non-provisional application claims priority under 35 U.S.C. § 119(a) to Patent Application No. 105113615 filed in Taiwan, R.O.C. on Apr. 29, 2016, the entire contents of which are hereby incorporated by reference.

BACKGROUND

Technical Field

The present invention relates to a keyboard of computing devices such as a computer, a mobile device, or a head-up display/head-mounted display/virtual reality display device, and in particular, to a physical keyboard supporting both a touch control operation and a keystroke operation.

Related Art

Because a conventional computer keyboard can generate a key signal only in a keystroke (that is, depressing a key) operation manner and cannot support a new operation manner for a newly emerged touch control-operated operating system (cannot generate a key signal in a touch manner), when a user has a requirement on a touch control operation on the halfway of typing data, the user has to move his hand to an externally-connected touchpad or a touch control screen. In current days when the touch control operation manner is popular, the conventional computer keyboard cannot be used in the touch control operation manner.

With the emergence of the touch control technology in recent years, touchpads become increasingly popular and also change some habits of users in aspects of operations and data entering, a touch control virtual keyboard is a technology emerges at the proper time, which combines the touchpad and the virtual keyboard (On-Screen Keyboard) technology into one technology. A user can type data by gently touching keys of an on-screen keyboard on a touchscreen using his fingers and can perform an operation in cooperation with a touch control gesture (such as a touch control sliding). Although the conventional touch control virtual keyboard provides convenience of the touch control operation to the user, the conventional touch control on-screen keyboard lacks of touch and feedback force, and it is not suitable for users who need to continuously type a large amount of data.

The prior art has its own disadvantages, this is, the prior art cannot satisfy requirements of the user. Therefore, it is necessary to improve the prior art and provide a keyboard apparatus having physical touch control keys, so that on one hand, the user types data with the assistance of the sense of touch and the feedback force of physical keys, and on the other hand, the user enjoys the convenience of a touch control gesture operation. When the user has a requirement on a touch control operation on the half way of data typing, the user can directly perform an operation and does not need to move his hands away from a keyboard, thereby compensating disadvantages of the prior art.

SUMMARY

In view of this, the present invention provides a touch control keyboard which is intended for a user to generate a key signal in a keystroke operation manner as well as generate a key signal in a touch manner by using the same keyboard, avoiding troubles of respectively generating two types of key signals by using two different apparatuses.

An embodiment of the present invention provides a touch control keyboard, including a supporting plate, a plurality of keycaps, a plurality of supporting housings, a plurality of conductive distributions, a first circuit board, and a second circuit board. Each keycap includes a keycap column, a cap, and a touch key part. The keycap column is fixed to the cap. The touch key part is disposed at a contact surface of the cap opposite to another side of the keycap column and has a coupling capacitor. Each supporting housing includes a fixed end and an open end opposite to each other, and the fixed end is fixed to the supporting plate. The keycap columns of the keycaps are respectively combined to the supporting housings. Each pair of conductive distributions is correspondingly disposed on the keycap and the supporting housing connected to each other and is electrically connected to a touch key part of the keycap. The first circuit board includes a plurality pairs of conductive wires, and the pairs of conductive wires are electrically connected to the touch key parts by means of the pairs of conductive distributions, to detect the coupling capacitor to generate a first key signal. The second circuit board includes a plurality of key contact points and a plurality of elastic components configured respectively corresponding to the key contact points. Each elastic component receives squeezing of a corresponding keycap column, so that a corresponding key contact point is stressed and changes from a normally open state to a conductive state to generate a second key signal.

The following implementation manners describe in detail features and advantages of the present invention. The content enables any person skilled in the art to know technical content of the present invention and implement the technical content. A person skilled the art can easily understand the objectives and advantages of the present invention according to the content, the application scope, and drawings disclosed in this specification.

DETAILED DESCRIPTION

The present invention is applied to, but is not limited to, computing devices such as a personal computer (PC/Mac), a notebook computer (Laptop/Portable Computer), a smartphone, a tablet computer, a smart television, a head-up display device, a head-mounted display device, a virtual reality display device, and a video game console (or TV Game Console), which are in communication connection with the present invention. A manner for the communication connection may be a wireless communication manner or a wired communication manner. Users can use the present invention to type data as well as touch control.

Accompanying drawings of this specification are intended to describe functions and technical features of the present invention, but are not intended to limit appearance of the present invention.

Figure 1:
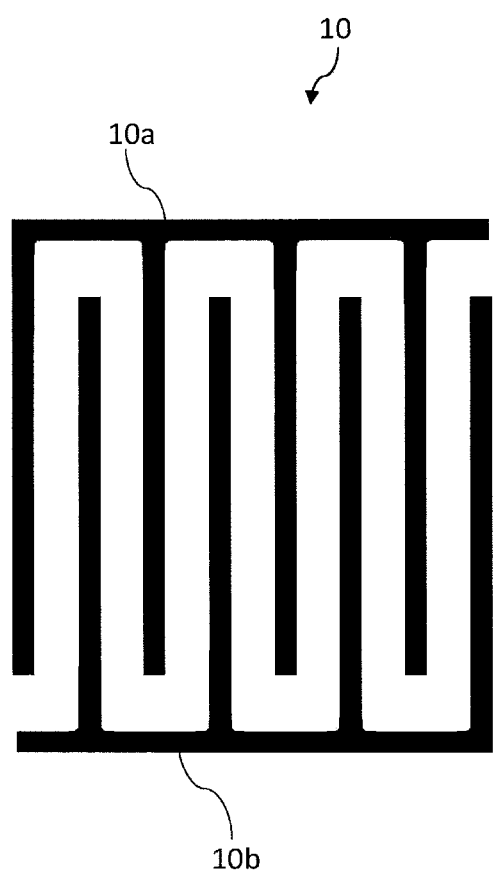
FIG. 1 is a schematic diagram of distribution of a touch key part according to an embodiment of the present invention.

Referring to FIG. 1, FIG. 1 is a schematic diagram of distribution of a touch key part 10 according to a first embodiment of the present invention. A touch key part 10 is combined by a first detection electrode 10a and a second detection electrode 10b. The first detection electrode 10a and the second detection electrode 10b which are neighboring and non-conductive to each other to form a coupling capacitor. In an embodiment, the first detection electrode 10a and the second detection electrode 10b are fork-shaped and interlaced with each other. The touch key part 10 is made from a highly conductive material. The touch key part 10 is located at an upper outer surface (that is, a contact surface capable of being touched by fingers) of a keycap 12a. For convenience of description and identification, the first detection electrode 10a and the second detection electrode 10b are presented in black bold lines herein, but a color of the touch key part 10 is not limited in the present invention. In some embodiments, the touch key part 10 is made from a material of a highly conductive polymer. A dye of any color may be added in a manufacturing process, so that the manufactured touch key part 10 and the keycaps 12a are of the same color and look like a one-piece component in appearance and are relatively artistic. Alternatively, colors of a high contrast ratio may be selected to respectively manufacture the touch key part 10 and the keycap 12a, so that the touch key part 10 has an eye-attracting visual effect. In addition, appearance of the touch key part 10 is not limited in the present invention to being square as the figure shows. In some embodiments, appearance of the touch key part 10 may also be ring-shaped (which is commonly seen in keys of a conventional touch control electronic apparatus and is not shown in the figure).

Figure 2:
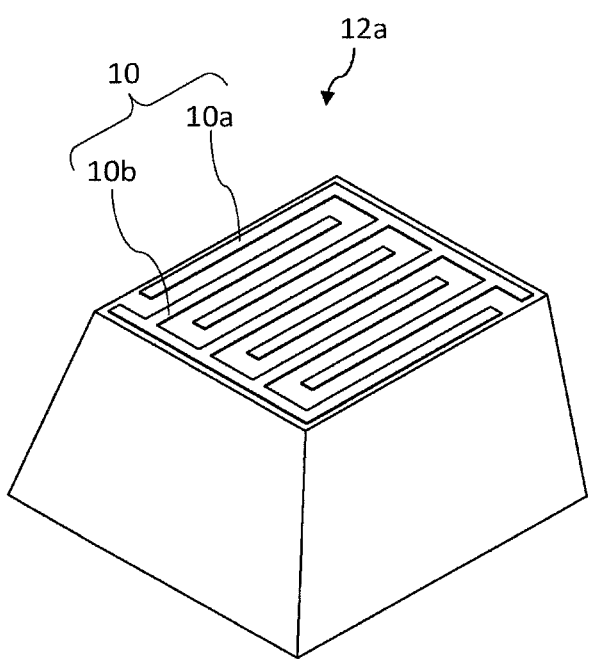
FIG. 2 is an axonometric view of a keycap according to a first embodiment of the present invention.

Referring to FIG. 2, FIG. 2 is an axonometric view of a keycap 12a according to a first embodiment of the present invention. The touch key part 10 on the keycap 12a of the first embodiment is presented in an embossed manner, but it is not limited that the touch key part 10 should be higher than the surface of the keycap 12a. In some embodiments, the upper outer surface of the keycap 12a is a flat surface (that is, the touch key part 10 is internally embedded into the keycap 12a, so that the touch key part 10 and plastic of the keycap 12a in a gap is of the same height), so that a user cannot feel a difference in a sense of finger touch. For convenience of description, a mark representing each of the keycaps 12a is omitted in the figure, but this is not intended to limit a printed mark of the keycap 12a of the present invention. Actually, the printed mark on the keycap 12a, unless the keycap 12a uses any ablation and etching method, does not affect normal operations of the touch key part 10.

Figure 3:
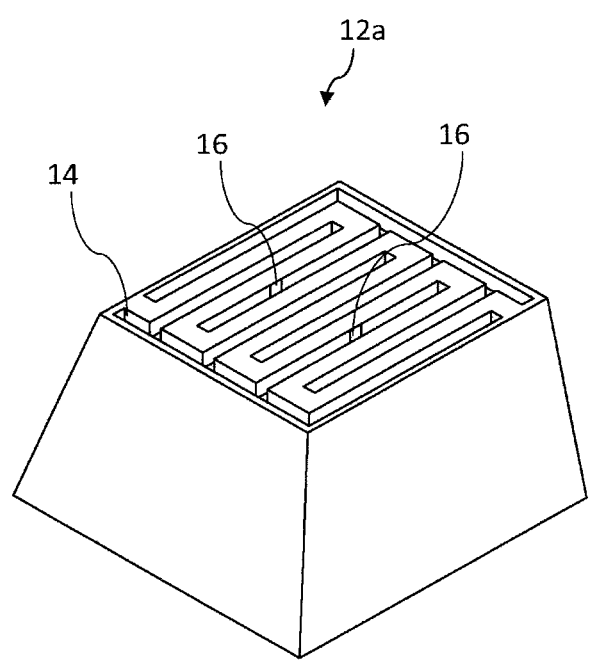
FIG. 3 is an axonometric view of a preserved groove of the keycap according to the first embodiment of the present invention.
Figure 4:
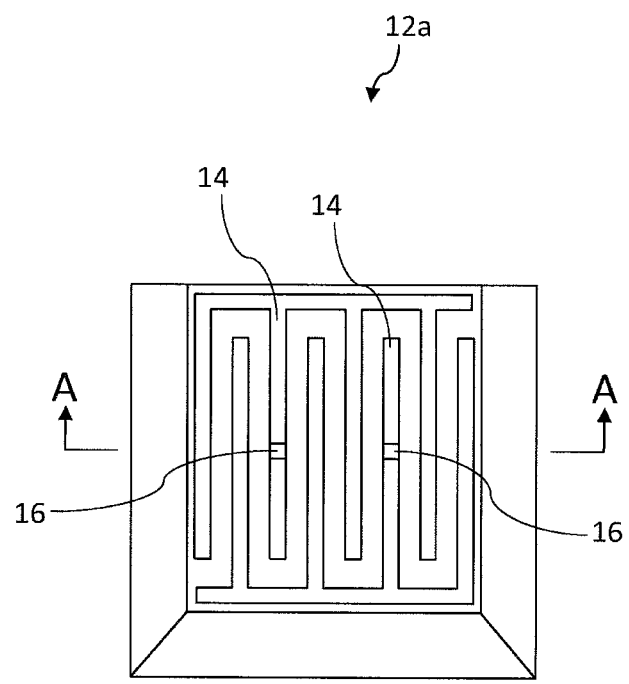
FIG. 4 is a top view of the preserved groove of the keycap according to the first embodiment of the present invention.

Subsequently, refer to FIG. 3 and FIG. 4 together. FIG. 3 is an axonometric view of a preserved groove of the keycap 12a according to the first embodiment of the present invention. FIG. 4 is a top view of the preserved groove of the keycap according to the first embodiment of the present invention. Manufacturing methods of the keycap 12a and the touch key part 10 are described below. In some embodiments, after plastic injection molding is performed on the keycap 12a by means of a keycap mould, a touch key part groove 14 fitting distribution shapes of the first detection electrode 10a and the second detection electrode 10b, and a through hole 16 located below the first detection electrode 10a and the second detection electrode 10b are manufactured by means of a chemical etching or laser etching process. Subsequently, a highly conductive material in liquid is injected into the touch key part groove 14 and the through hole 16 by using a filling, coating, or printing technique and is waited to be consolidated. Alternatively, the molded touch key part 10 in solid state (such as a highly conductive polymer, or a copper foil) may be assembled in the touch key part groove 14 and the through hole 16 of the keycap 12a. In some embodiments, a double shot mould injection (that is, Double Shot Injection Molding, also referred to as overmolding) manufacturing process may also be used, and the keycap 12a and the touch key part 10 are manufactured by double shot plastic injection molding. For example, first-shot injection is performed on the highly conductive material by using a mould of the touch key part 10 including a pair of conductive bars, and after the highly conductive material is molded, a keycap mould is additionally assembled and second-shot injection is performed on an ABS (Acrylonitrile Butadiene Styrene Copolymers), PBT (Polybutylene Terephthalate), or POM (Polyformaldehyde) material. It is suitable contrariwise. First-shot injection is performed on ABS, PBT, or POM by using a keycap mould preserving the touch key part groove 14 and the through hole 16, and after ABS, PBT, or POM is molded, second-shot injection is performed on the highly conductive material. By means of the foregoing manufacturing methods, the highly conductive material may be disposed in the touch key part groove 14 and the through hole 16, so that the upper outer surface of the keycap 12a is flat. In this case, a position and a section of the foregoing through hole 16 depend on distribution and an interval between the first detection electrode 10a and the second detection electrode 10b. In addition, positions of a first conductive bar 24a and a second conductive bar 24b that are mentioned below should also be considered.

Figure 5:
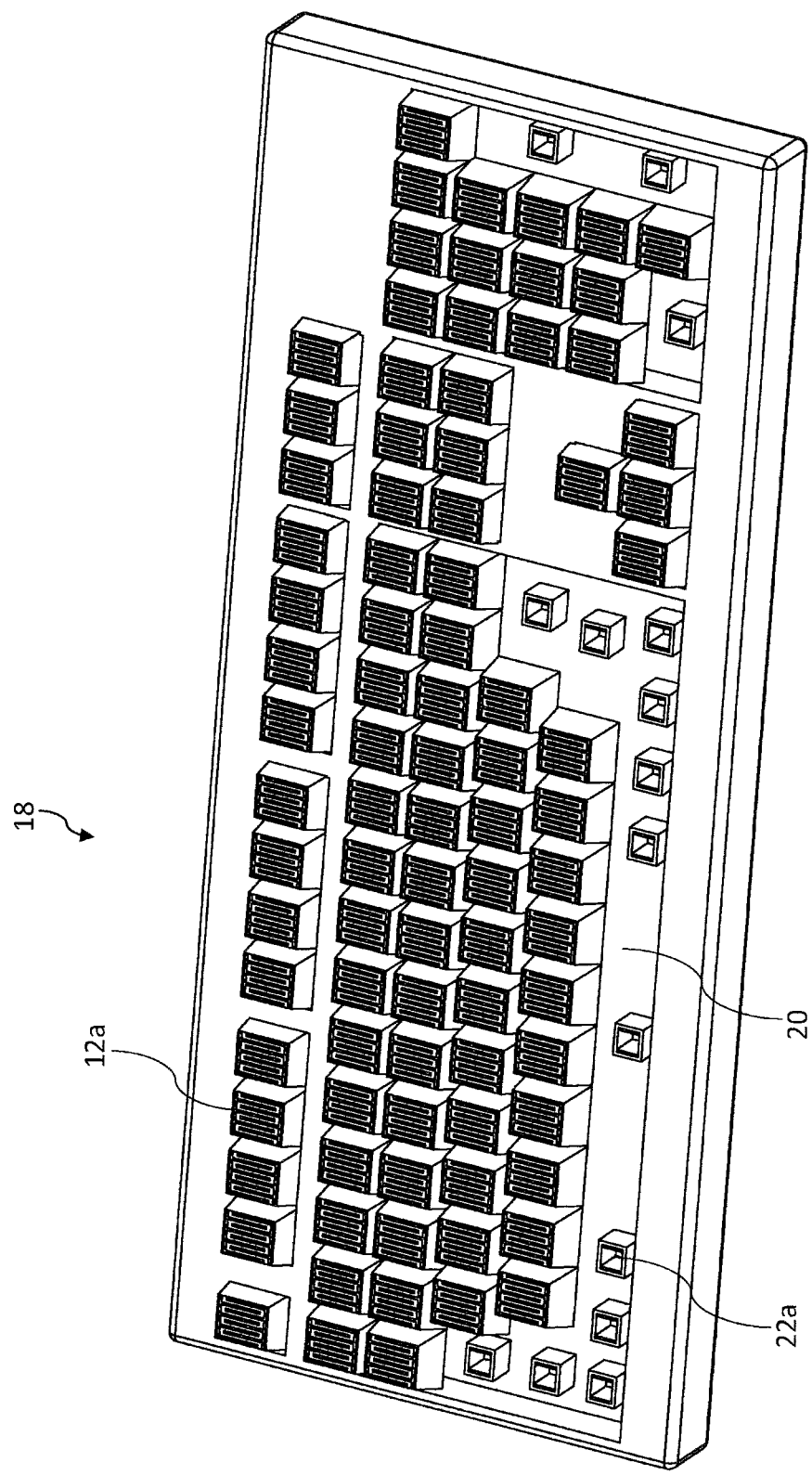
FIG. 5 is an axonometric view of the keyboard according to the first embodiment of the present invention.

Referring to FIG. 5, FIG. 5 is an axonometric view of a keyboard 18 according to the first embodiment of the present invention. For convenience of description below, the keyboard 18 in the figure is obtained after some keycaps 12a are removed to display structures of a supporting plate 20 and supporting housings 22a below the keycap 12a. In some embodiments, the supporting plate 20 is a part of an upper case (also referred to as a top-cover) of the keyboard 18, that is, the supporting plate 20 and the keyboard 18 are an integral located on an upper surface of the keyboard 18. In other embodiments, the supporting plate 20 is located at a lower layer of the upper case of the keyboard 18. The supporting plate 20 of both embodiments is provided with the supporting housing 22a, and the supporting plate 20 is formed integrally with the supporting housings 22a. Apart from the keycap 12a, the supporting plate 20, and the supporting housings 22a, the keyboard 18 further includes components such as a first circuit board 28, a second circuit board 36a, an elastic component (such as a key switch 40 or a rubber dome 32), and a keyboard scanning circuit 60, which are described below.

Figure 6:
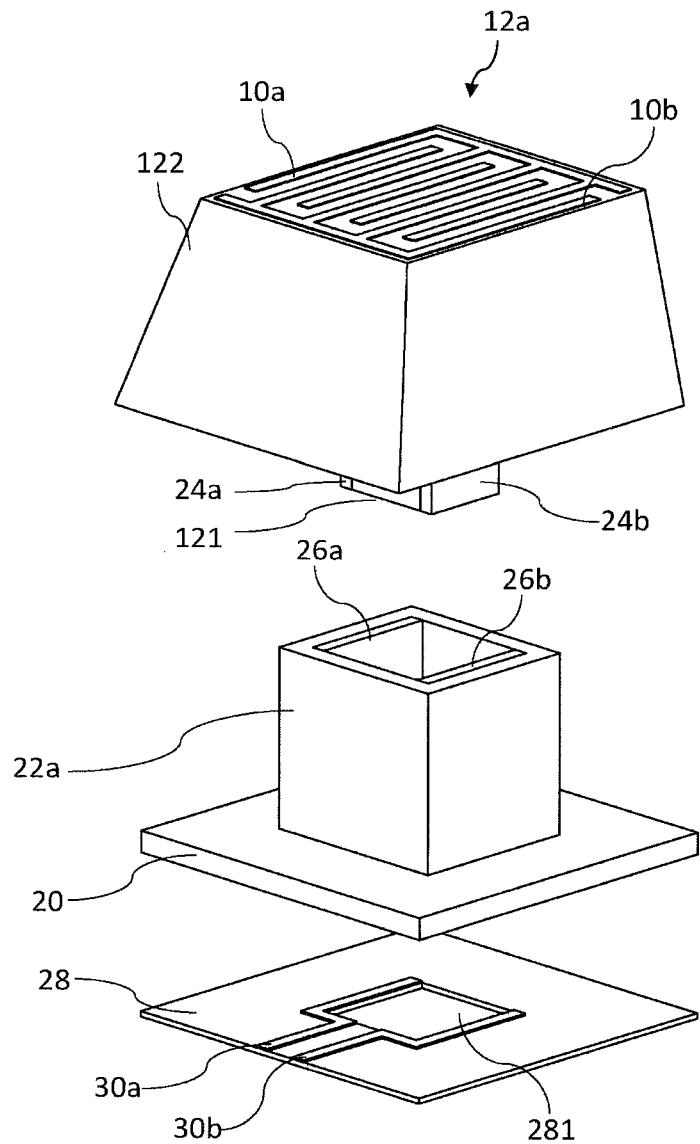
FIG. 6 is a schematic disassembled axonometric view from the keycap to a first circuit board according to the first embodiment of the present invention.

Referring to FIG. 6, FIG. 6 is a schematic disassembled axonometric top view from the keycap 12a to a first circuit board 28 according to the first embodiment of the present invention. To make the figure clearer, full views of the supporting plate 20 and the first circuit board 28 are not completely drawn herein. The keycap 12a is mushroom-shaped and includes a keycap column 121 located in a lower end of the keycap 12a and a cap 122 fixed to an upper end of the keycap column 121. The supporting housing 22a is a hollow column having two openings at both ends. A tetragonal prism is used herein as an example, but in some embodiments, the supporting housing 22a may be a column of other geometric shapes, such as a cylinder. A lower end of the supporting housing 22a is a fixed end which is fixed to the supporting plate 20; and an upper end of the supporting housing 22a is an open end used to accommodate the keycap column 121 of the keycap 12a and can be combined to the keycap column 121, so that the keycap 12a is installed on the keyboard 18 after being assembled with the supporting housing 22a. The keycap column 121 may be hollow or solid, and a hollow keycap column 121 is used as an example here. An outer surface (that is, a surface neighboring to the supporting housing 22a) of the keycap column 121 is provided with a first conductive bar 24a and a second conductive bar 24b respectively corresponding to the positions of the through holes 16. In this case, the first conductive bar 24a and the second conductive bar 24b are disposed opposite to each other, that is, disposed on two opposite surfaces of the keycap column 121. An inner wall of the open end of the supporting housing 22a has a first conductive wall 26a and a second conductive wall 26b. Positions of the first conductive wall 26a and the second conductive wall 26b are disposed corresponding to positions of the first conductive bar 24a and the second conductive bar 24b of the keycap column 121. In a case when the keycap 12a is assembled on the supporting housing 22a, the first conductive wall 26a and the first conductive bar 24a are in mutual contact and electrically connected to each other; and the second conductive wall 26b and the second conductive bar 24b are in mutual contact and electrically connected to each other. The first conductive wall 26a runs through the supporting plate 20 and extends out of a bottom surface (that is, another surface opposite to the keycap 12a, and the surface facing the first circuit board 28) of the supporting plate 20; and the second conductive wall 26b runs through the supporting plate 20 and extends out of the bottom surface (that is, another surface opposite to the keycap 12a, and the surface facing the first circuit board 28) of the supporting plate 20.

Both the supporting housing 22a and the supporting plate 20 are made from a non-conductive material. In some embodiments, the supporting housing 22a and the supporting plate 20 are molded by means of plastic injection, and a conductive plate, such as a conductive plate made from a highly conductive polymer or a copper foil, is adhered to the inner wall (that is, the first conductive wall 26a and the second conductive wall 26b) of the supporting housing 22a. In some embodiments, a double shot mould injection manufacturing process may be used. A first-shot mould injection is performed on a non-conductive material (such as ABS) by using a supporting plate mould to manufacture the supporting plate 20 and the supporting housings 22a, and after the supporting plate 20 and the supporting housings 22a are molded, a second-shot mould injection is performed on a highly conductive material to manufacture the first conductive wall 26a and the second conductive wall 26b.

Figure 7:
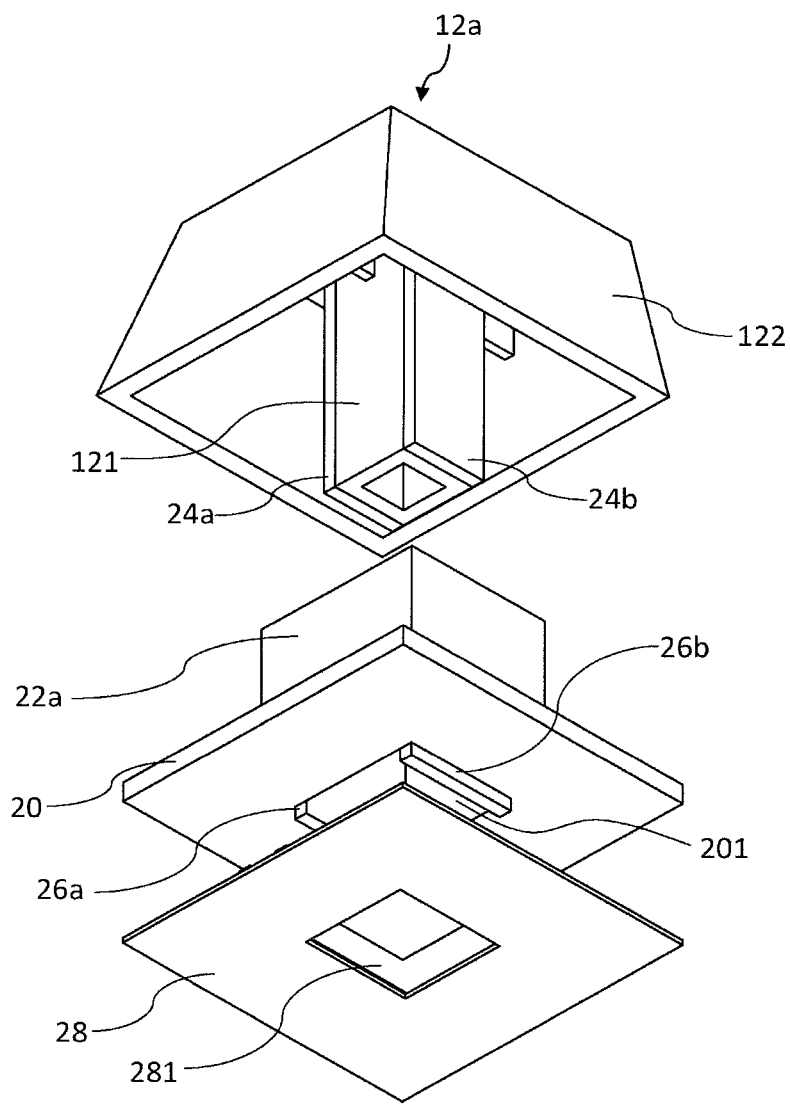
FIG. 7 is a schematic disassembled axonometric bottom view from the keycap to the first circuit board according to the first embodiment of the present invention.

FIG. 7 is a schematic disassembled axonometric bottom view from the keycap 12a to the first circuit board 28 according to the first embodiment of the present invention. Referring to FIG. 6 and FIG. 7 together, FIG. 6 and FIG. 7 describe a conductive distribution from the touch key part 10 on the keycap 12a to the first circuit board 28. The conductive distribution is correspondingly disposed on the keycap 12a and the keycap column 121 fixed to each other and is electrically connected to the touch key part 10 of the keycap 12a. Specifically, the conductive distribution is mainly formed by the first conductive bar 24a, the second conductive bar 24b, the first conductive wall 26a, and the second conductive wall 26b described below and is electrically connected between the touch key part 10 and the first conductive wire 30a and second conductive wire 30b. The first detection electrode 10a is connected to the first conductive bar 24a by using a conductor inside the through hole 16. After the keycap 12a is assembled on the supporting housing 22a (the keycap column 121 at the lower end of the keycap 12a is assembled in the supporting housing 22a), the first conductive bar 24a is connected to the first conductive wall 26a, and the first conductive wall 26a runs through the supporting plate 20 and extends out of a bottom surface (that is, the surface facing the first circuit board 28) of the supporting plate 20. A lower part of the supporting plate 20 is provided with the first circuit board 28, of which a side neighboring to the supporting plate 20 is a circuit and a position corresponding to the keycap 12a is provided with the first conductive wire 30a and the second conductive wire 30b. When the circuit of the first circuit board 28 is upward attached to the lower part of the supporting plate 20, the first conductive wall 26a and the first conductive wire 30a are connected in conduction. Based on this, a 3-dimensional and movable conductive distribution is completed between the first detection electrode 10a and the first conductive wire 30a. A layout and a connection manner between the second detection electrode 10b and the second conductive wire 30b are the same as the layout and connection manner between the first detection electrode 10a and the first conductive wire 30a described above. A conductive distribution in an order of the second detection electrode 10b, the second conductive bar 24b and the second conductive wall 26b to the second conductive wire 30b can also be formed, and details are not described herein again. After assembling is completed, when a finger does not touch the keycap 12a, a coupling capacitor exists between the first detection electrode 10a and the second detection electrode 10b, and in this case, there is a fixed value of the capacitor. After the finger touches the keycap 12a, a change in the charges between the first detection electrode 10a and the second detection electrode 10b causes the value of the coupling capacitor to change. The conductive distribution between the touch key part 10 and the first circuit board 28 is electrically connected to a touch control determining unit 48 (shown in FIG. 14), so that the touch control determining unit 48 detects, by using the conductive distribution, a change in the value of the coupling capacitor caused by a touch of a user on the touch key part 10 of the keycap 12a, to generate a key signal (referred to as "a first key signal" below).

In some embodiments, to ensure good contact between the first conductive bar 24a and the first conductive wall 26a, and between the second conductive bar 24b and the second conductive wall 26b, that keystroke feelings are not affected when the first conductive bar 24a, the first conductive wall 26a, the second conductive bar 24b, and the second conductive wall 26b are excessively close to each other, not only precisely dimensional designing and manufacturing, and a coefficient of friction of a material from which a conductive bar and a conductive wall are made (under a condition when other factors are the same, the lower coefficient of friction relative to the two indicates smoother of the keystrokes) are considered, but also an appropriate amount of conductive ointment may further be added to increase contact areas of the two, reduce the coefficient of friction, and reduce the occurrence of air gaps. The conductive ointment is a thickening lubricant and includes a superfine conductive raw material (such as ultrafine copper powder).

In this embodiment, two sides of the inner wall of the supporting housing 22a, that are not neighboring, are provided with the first conductive wall 26a and the second conductive wall 26b (that is, the first conductive wall 26a and the second conductive wall 26b are correspondingly disposed), corresponding to the positions of the first conductive bar 24a and the second conductive bar 24b. In some embodiments, the first conductive wall 26a and the second conductive wall 26b may be disposed at two neighboring sides of the inner wall of the supporting housings 22a, or the same side of the inner wall. If the first conductive wall 26a and the second conductive wall 26b are at the same side, the first conductive wall 26a and the second conductive wall 26b are not connected to each other. However, no matter the first conductive wall 26a and the second conductive wall 26b are disposed at neighboring sides or sides that are not neighboring, or even on the same side, the first conductive wall 26a and the second conductive wall 26b need to be disposed corresponding to the first conductive bar 24a and the second conductive bar 24b.

Figure 8:
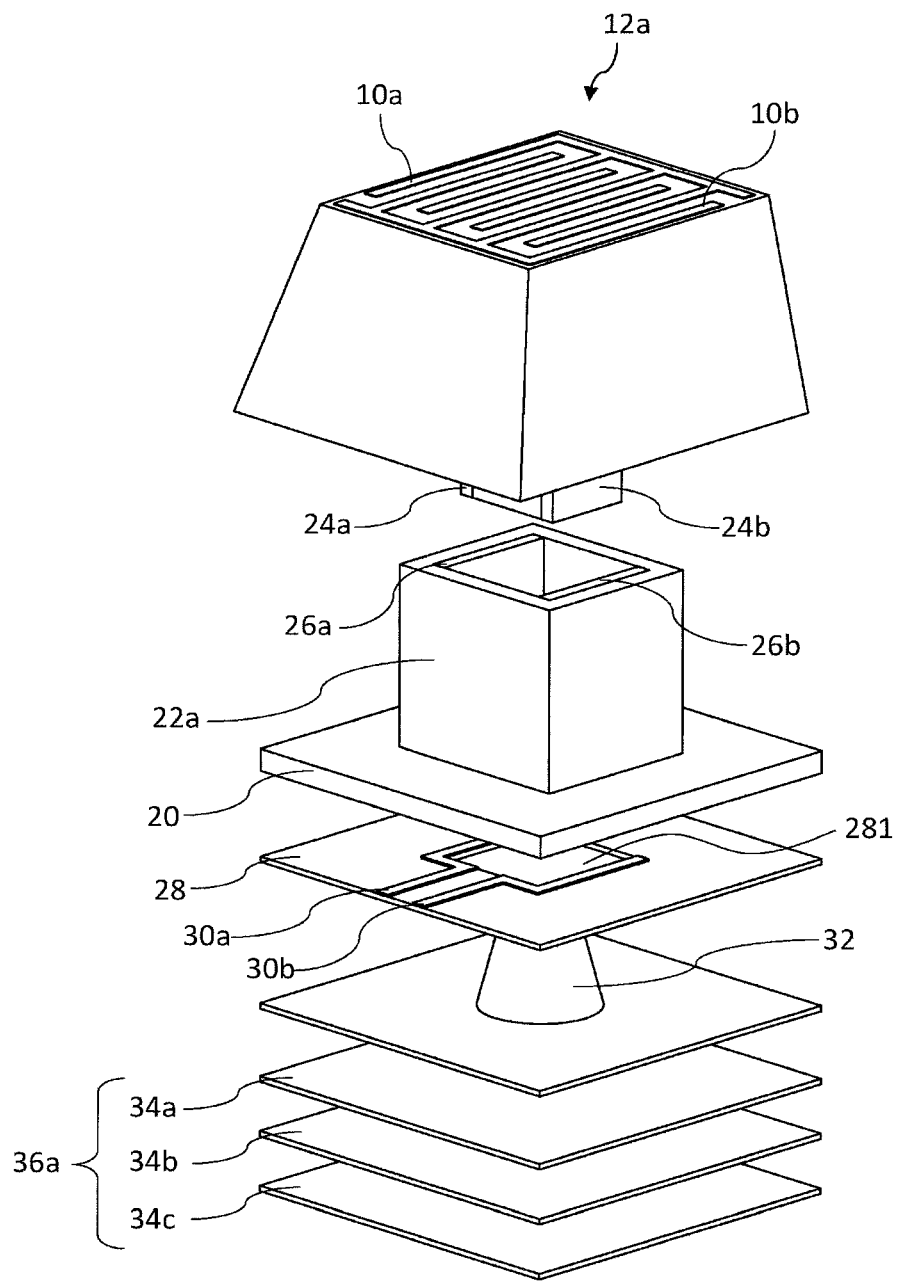
FIG. 8 is a schematic disassembled axonometric view from the keycap to a second circuit board according to the first embodiment of the present invention.
Figure 9:
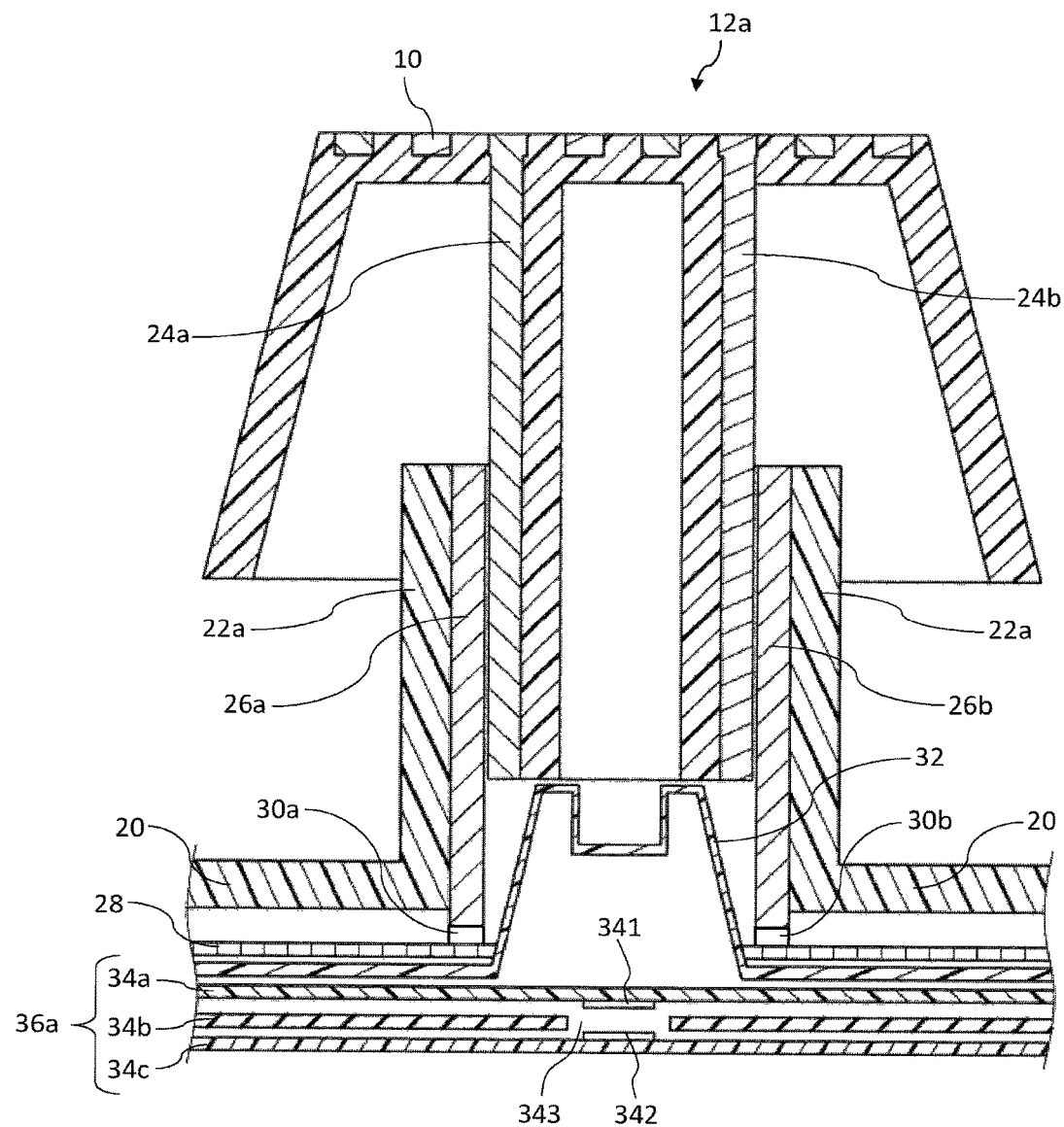
FIG. 9 is a sectional view from the keycap to the second circuit board according to the first embodiment of the present invention.

Refer to FIG. 8 and FIG. 9 together. FIG. 8 is a schematic disassembled axonometric view from the keycap 12a to a second circuit board 36a according to the first embodiment of the present invention. FIG. 9 is a sectional view, along an A-A line of FIG. 4, from the keycap 12a to the second circuit board 36a according to the first embodiment of the present invention. The conductive distribution between the touch key part 10 of the keycap 12a and the first circuit board 28 is described above, and details are not described herein again. The second circuit board 36a includes a plurality of key contact points and a plurality of elastic components configured respectively corresponding to the key contact points (herein, a rubber dome 32 is used as an example for description). Each elastic component receives squeezing of a corresponding keycap column 121, so that a corresponding key contact point is stressed and changes from a normally open state (non-conductive state) to a conductive state, by which the second circuit board 36a can generate a second key signal. Further descriptions are made below. The second circuit board 36a may include an upper layer thin film circuit board 34a, an insulating layer 34b, and a lower layer thin film circuit board 34c layered according to a sequence (the three are collectively referred to as the second circuit board 36a, that is, a thin film circuit board, also referred to as a membrane circuit board). The rubber dome 32 is disposed on above of the upper layer thin film circuit board 34a. A via 201 (shown in FIG. 7) is further provided at a position of the supporting plate 20 corresponding to the lower part of the keycap column 121, and a via 281 is also provided at a position of the first circuit board 28 corresponding to the lower part of the keycap column 121, so that when the keycap 12a is depressed, the keycap column 121 can move through the via 201 and 281 towards the second circuit board 36a, and further squeeze the rubber dome 32. In addition, the via 281 is located between the first conductive wire 30a and the second conductive wire 30b. A circuit of the upper layer thin film circuit board 34a is downward and a connection point 341 is disposed at a lower part of the upper layer thin film circuit board 34a corresponding to the rubber dome 32, and a circuit of the lower layer thin film circuit board 34c is upward and a connection point 342 is also disposed at a lower part of the lower layer thin film circuit board 34c corresponding to the rubber dome 32. The connection points 341 and 342 (collectively referred to as "key contact points") of the upper layer thin film circuit board 34a and the lower layer thin film circuit board 34c are separated by the insulating layer 34b. The insulating layer 34b is provided with an opening 343 at a position corresponding to the key contact points, that is, the connection points 341 and 342 of the upper layer thin film circuit board 34a and the lower layer thin film circuit board 34c are in normally open state. After a user depresses the keycap 12a, the keycap column 121 at the lower end of the keycap 12a squeezes down the rubber dome 32, so that the connection point 341 of the upper layer thin film circuit board 34a runs through the opening 343 of the insulating layer 34b and is connected to the connection point 342 of the lower layer thin film circuit board 34c, becoming a conductive state. In other words, the keycap 12a is depressed so that the key contact points of the second circuit board 36a are in the conductive state for the user to generate a key signal (that is, a second key signal) in a keystroke operation manner The "keystroke" includes key-down (that is, depressing, to generate a "Make Code") and key-up (that is, releasing, to generate a "Break Code") of a key. This embodiment is applicable to a thin film type keyboard, that is, the second circuit board 36b is a thin film type circuit board.

To describe that the first conductive wall 26a and the second conductive wall 26b run through the supporting plate 20 and extend out of the bottom surface of the supporting plate so as to be connected to the first conductive wire 30a and the second conductive wire 30b, extended parts of the first conductive wall 26a and the second conductive wall 26b, and thicknesses of the first conductive wire 30a and the second conductive wire 30b are deliberately highlighted herein, which causes an illusion that there is a large gap between the supporting plate 20 and the first circuit board 28 in the figure. Actually, the supporting plate 20 and the first circuit board 28 are closely attached to each other.

In some embodiments, the first conductive wire 30a and the second conductive wire 30b are directly wiring at a bottom side of the supporting plate 20 corresponding to another surface of the supporting housing 22a and are in conduction with the first conductive wall 26*a* and the second conductive wall 26*b*. That is, in this embodiment, the first circuit board 28 is integrated with the supporting plate 20, and the bottom side (that is, an original position of the first circuit board 28 in FIG. 9) of the supporting plate 20 is coated or attached with a thin film to protect the first conductive wire 30*a* and the second conductive wire 30*b* at the bottom side of the supporting plate 20.

Figure 10:
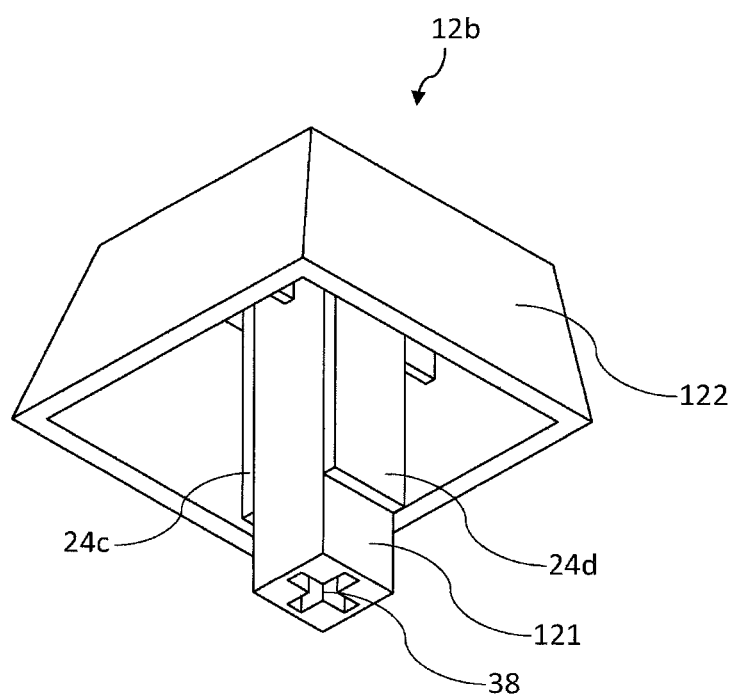
FIG. 10 is an axonometric bottom view of a keycap according to a second embodiment of the present invention.
Figure 11:
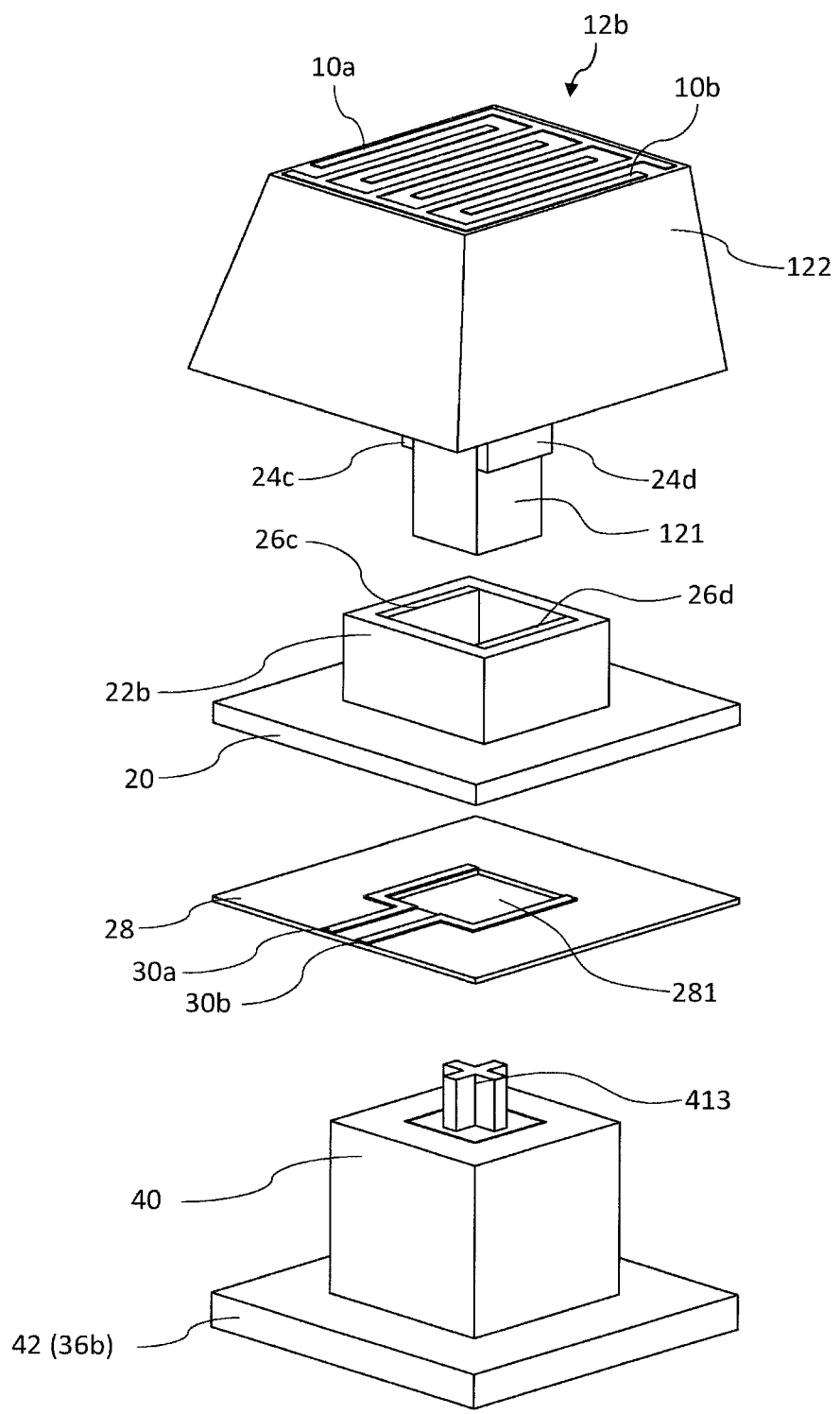
FIG. 11 is a schematic disassembled axonometric view from the keycap to a second circuit board according to the second embodiment of the present invention.
Figure 12:
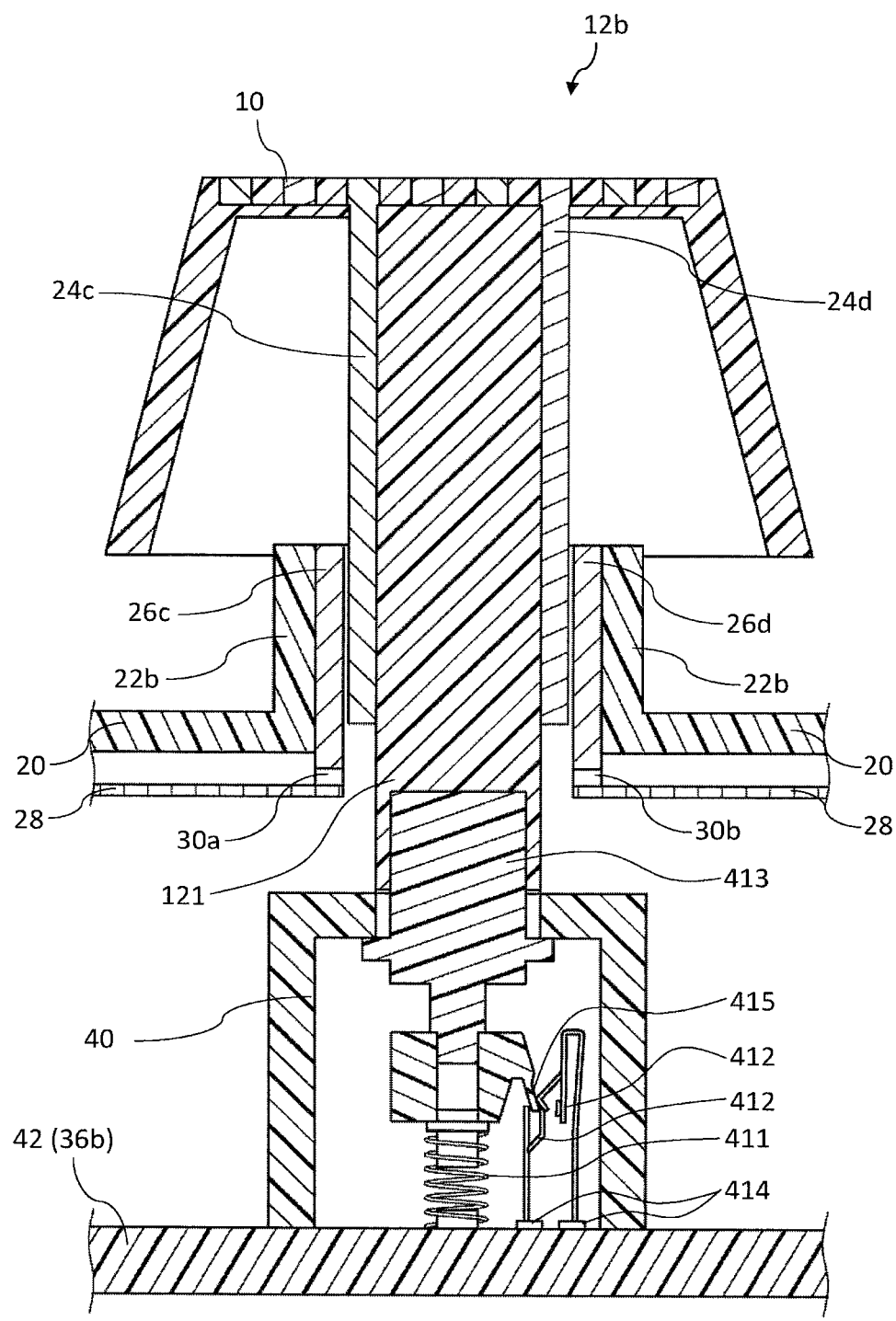
FIG. 12 is a sectional view from the keycap to the second circuit board according to the second embodiment of the present invention.

Referring to FIG. 10, FIG. 11, and FIG. 12, FIG. 10, FIG. 11, and FIG. 12 are schematic diagrams of a second embodiment of the present invention. Same parts of this embodiment and the first embodiment are represented by same structures and component symbols and are not described again. FIG. 10 is an axonometric bottom view of a keycap 12*b* according to a second embodiment of the present invention. FIG. 11 is a schematic disassembled axonometric view from the keycap 12*b* to a second circuit board 36*b* according to the second embodiment of the present invention. FIG. 12 is a sectional view (the same as FIG. 4, the section view taken along the A-A line of two through holes 16) from the keycap 12*b* to the second circuit board 36*b* according to the second embodiment of the present invention. This embodiment is applicable to a mechanical keyboard, that is, the rubber dome 32 in the previous embodiment is replaced with a key switch 40 (also referred to as a mechanical switch). The upper layer thin film circuit board 34*a,* the insulating layer 34*b,* and the lower layer thin film circuit board 34*c* in the previous embodiment are replaced with a printed circuit board 42. A top end of the key switch 40 includes a stem 413 of the key switch. In this embodiment, the stem 413 of the key switch has a cross-shaped stem (also referred to as Cherry MX Mount), which is one of commonly-seen standard stems of the mechanical keyboard. To combine with the cross-shaped stem of the key switch 40, a cross groove 38 is provided at a lower end of the keycap column 121 of the keycap 12*b* in this embodiment. In some other embodiments, the stem 413 of the key switch 40 may also use a flat-shaped stem (also known as a flat-head stem, not shown), and a flat-shaped groove (not shown) is provided at the lower end of the keycap column 121 of the keycap 12*b*. In other words, a groove fitting a shape of the stem 413 of the key switch 40 may be provided at the lower end of the keycap column 121 of the keycap 12*b*. The key switch 40 has accommodation space inside which can accommodate a spring 411 and two copper foils 412. Before the keycap 12*b* is depressed, the key switch 40 has an isolating branch 415 located between the two copper foils 412, so that the two copper foils 412 are non-conductive. When the keycap 12*b* is depressed, the keycap column 121 of the keycap 12*b* pushes down the stem 413 of the key switch 40 into the accommodation space, so that the two copper foils 412 inside the key switch 40 are in mutual contact and conductive. The copper foils 412 are respectively electrically connected to two key contact points (a key contact point 414 is in a normally open state) on the printed circuit board 42, so that the key contact point 414 is in a conductive state to generate a key signal (that is, a second key signal of the present invention, a "Make Code"). Later, when a finger moves away from the keycap 12*b,* the spring 411 inside the key switch 40 rebounds the stem 413 of the key switch 40 back to its original place, and the copper foil 412 also leaves the key contact point 414, that generates the second key signal again (that is, a "Break Code"). To ensure that the stem 413 can be pushed into the key switch 40, the first conductive bar 24*c* and the second conductive bar 24*d* in this embodiment are shorter than the first conductive 24*a* bar and the second conductive bar 24*b* in the previous embodiment, but still have enough contacting areas to be connected to the first conductive wall 26*c* and the second conductive wall 26*d* of the inner wall of the supporting housings 22*b*.

To describe that the first conductive wall 26*c* and the second conductive wall 26*d* run through the supporting plate 20 and extend out of the bottom surface of the supporting plate 20 so as to be connected to the first conductive wire 30*a* and the second conductive wire 30*b,* extended parts of the first conductive wall 26*c* and the second conductive wall 26*d,* and thicknesses of the first conductive wire 30*a* and the second conductive wire 30*b* are deliberately highlighted herein, which causes an illusion that there is a large gap between the supporting plate 20 and the first circuit board 28 in the figure. Actually, the supporting plate 20 and the first circuit board 28 are closely attached to each other.

In some embodiments, the first conductive wire 30*a* and the second conductive wire 30*b* are directly wiring at a bottom side of the supporting plate 20 corresponding to another surface of the supporting housing 22*a* and are in conduction with the first conductive wall 26*c* and the second conductive wall 26*d*. That is, in this embodiment, the first circuit board 28 is integrated with the supporting plate 20, and the bottom side (that is, an original position of the first circuit board 28 in FIG. 12) of the supporting plate 20 is coated or attached with a thin film to protect the first conductive wire 30*a* and the second conductive wire 30*b* at the bottom side of the supporting plate 20.

Figure 13:
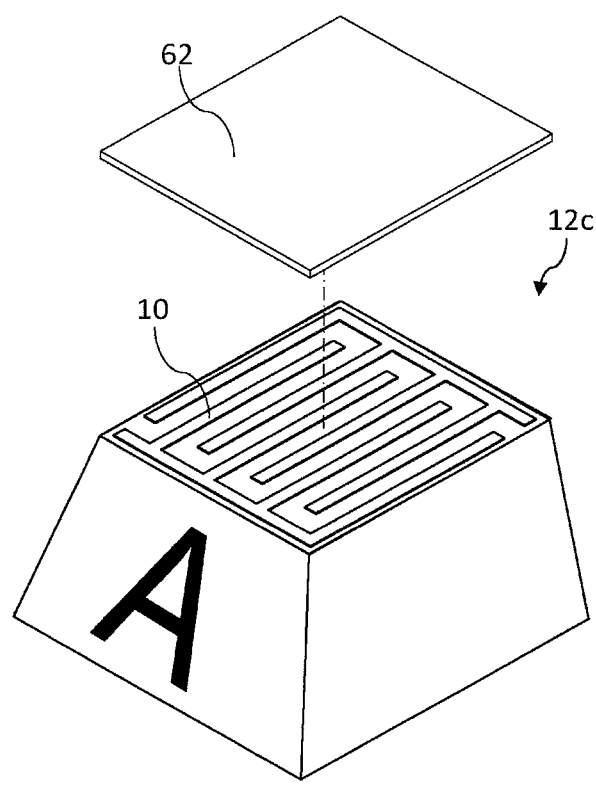
FIG. 13 is an axonometric view of a keycap according to a third embodiment of the present invention.

Referring to FIG. 13, FIG. 13 is schematic disassembled axonometric view of a keycap 12*c* according to a third embodiment of the present invention. A letter/number/symbol mark (a letter "A" herein in capital) may be printed on a side surface (that is, a side facing a user) of the keycap 12*c* neighboring to the side of the touch key part 10. In addition, a covering layer 62 may also be disposed on the keycap 12*c* to protect the touch key part 10. In some embodiments, a letter/number/symbol mark represented by each key may be printed on the upper part (not shown) of the keycap 12*c*. In this case, a transparent or colored covering layer 62 may be disposed on the keycap 12*c,* and the letter/number/symbol mark represented by each key may be printed on the covering layer. Alternatively, the letter/number/symbol mark represented by each key may be printed on the keycap 12*c* first, and then a transparent covering layer 62 may be provided.

Figure 14:
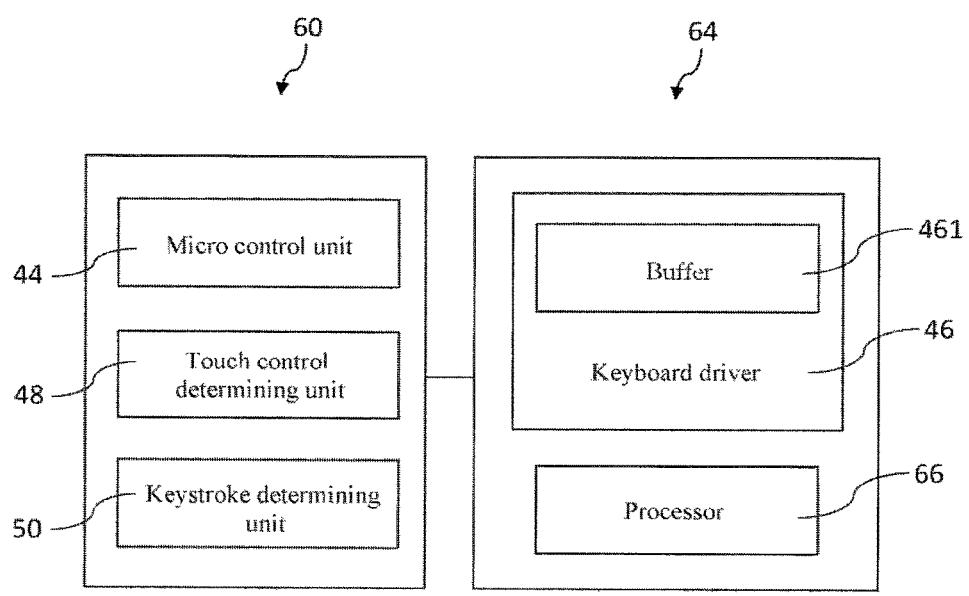
FIG. 14 is a systematic block diagram (1) of keyboard scanning circuit of the first, the second, and the third embodiment of the present invention and corresponding computing devices.
Figure 16:
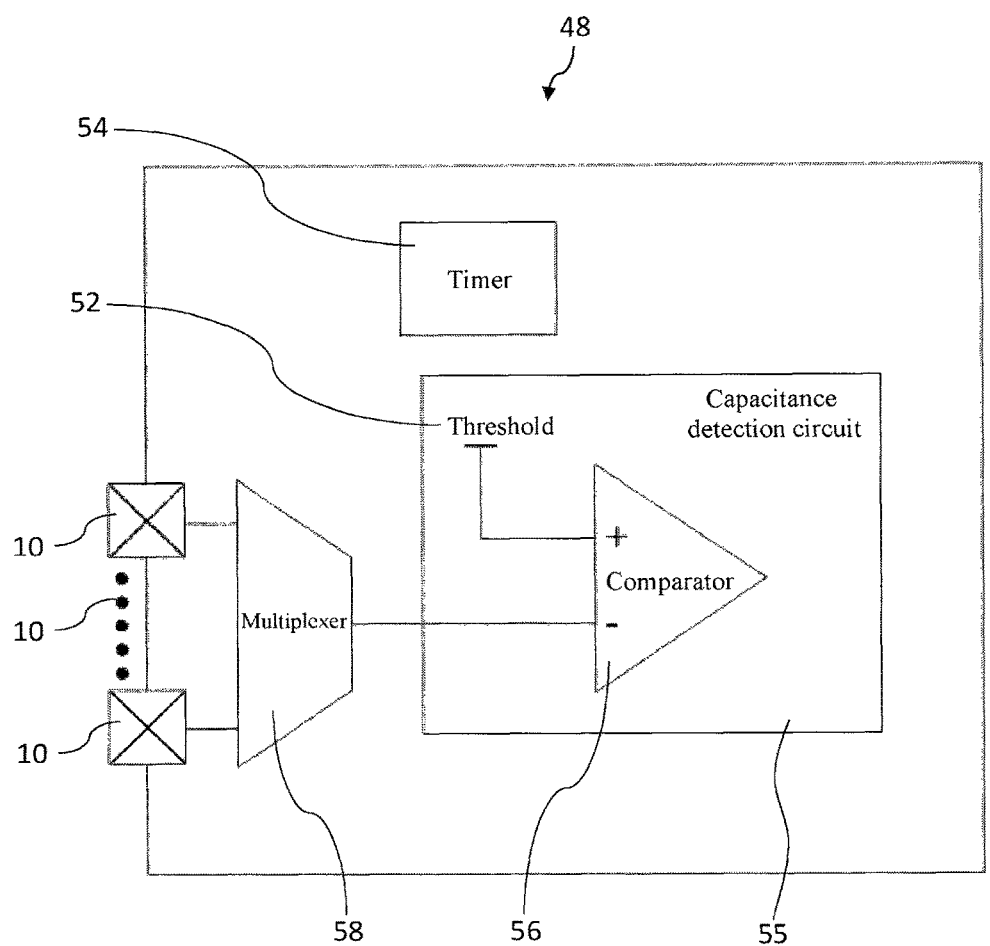
FIG. 16 is a circuit diagram of touch control determining units of the first, the second, and the third embodiment of the present invention.

Referring to FIG. 14 and FIG. 16 together, FIG. 14 is a systematic block diagram (1) of keyboard scanning circuit 60 of the first, the second, and the third embodiment of the present invention and corresponding computing devices 64, and FIG. 16 is a circuit diagram of a touch control determining unit 48. The keyboard scanning circuit 60 may be located on a circuit board independent of the first circuit board 28 and the second circuit board 36*b* described above, or may be partially or integrally disposed on the first circuit board 28 or the second circuit board 36*b*. Position relationships between the keyboard scanning circuit 60 and the first circuit board 28 and the second circuit board 36*b* are not limited in this embodiment of the present invention. The keyboard scanning circuit 60 includes a micro control unit 44, a touch control determining unit 48, and a keystroke determining unit 50, which may have independent circuits or may be integrated together, for example, implemented as a single integrated circuit (IC). The computing device 64 includes a processor 66 and a keyboard driver 46. The keyboard driver 46 is stored in a storage medium, such as a non-volatile memory, a hard-disk, a solid-state drive, or a memory card. The keyboard driver includes a buffer 461.

The keyboard scanning circuit 60 and the computing device 64 are in communication connection, that is, the keyboard 18 and the computing device 64 are in communication connection, the communication connection may be: 5 pin DIN connector (AT/XT keyboard), 6 pin Mini-DIN connector (PS/2 keyboard), USB connector (USB keyboard), or Bluetooth/RF/Wi-Fi (Wireless Keyboard), etc.

The touch control determining unit 48 includes a timer 54 and a capacitance detection circuit 55 connected to each other. The capacitance detection circuit 55 includes a comparator 56. A method for comparing changes in capacitance values by the capacitance detection circuit 55 includes a relaxation oscillator (alternatively referred to as an RC oscillation method) detection, charge transfer (alternatively referred to as comparison of charges) or continuous approximation (alternatively referred to as capacitance coupling analog conversion by using a capacitance-to-voltage convertor and an analog-to-digital convertor). If relaxation oscillator detection is used, the timer 54 is configured to calculate an RC oscillation frequency or period. If the charge transfer or the continuous approximation is used, the timer 54 is configured to time a charging time of the coupling capacitor. The touch control determining unit 48 is electrically connected to conductive wire 30a and 30b corresponding to each keycap 12a, 12b, or 12c and is configured to compare changes (which may virtually be changes in voltage of corresponding ends or changes in oscillation frequencies/periods) in values of the coupling capacitor of the keycap 12a, 12b, or 12c according to a threshold 52. When the changes exceed a threshold 52, it is determined that the keycap 12a, 12b, or 12c is detected to be touched, and a first key signal is generated. The threshold 52 may be set as a certain voltage value (not described in detail herein) by using a bleeder circuit, or the value (or a terminal voltage value or an oscillation frequency) of the coupling capacitor converted by using the analog-to-digital convertor in a digital manner is compared with the threshold set as the certain value.

The micro control unit 44 stores the first key signal to the buffer 461 by using the keyboard driver 46 and sends an interrupt request to the processor 66 of the computing device 64. The first key signal includes the code corresponding to the keycap 12a, 12b, or 12c. Subsequently, the processor 66 of the computing device 64 responds to the interrupt request and reads the first key signal from the buffer 461, so that the processor 66 can tell which one of the keycap 12a, 12b, or 12c is touched. The buffer 461 uses a first-in first-out (FIFO) data structure.

The keystroke determining unit 50 is electrically connected to the connection points 341 and 342 alternatively referred to as the key contact point 414, corresponding to each keycap 12a, 12b, or 12c, and is configured to detect changes in the connection points 341 and 342 (key contact point 414) from a normally open state to a conductive state due to a keystroke, to generate a second key signal. The micro control unit 44 stores the second key signal to the buffer 461 by using the keyboard driver 46 and sends an interrupt request to the processor 66 of the computing device 64. The second key signal includes the code corresponding to the keycap 12a, 12b, or 12c. Subsequently, the processor 66 of the computing device 64 responds to the interrupt request and reads the second key signal from the buffer 461, so that the processor 66 can tell which one of the keycap 12a, 12b, or 12c is depressed.

Figure 15:
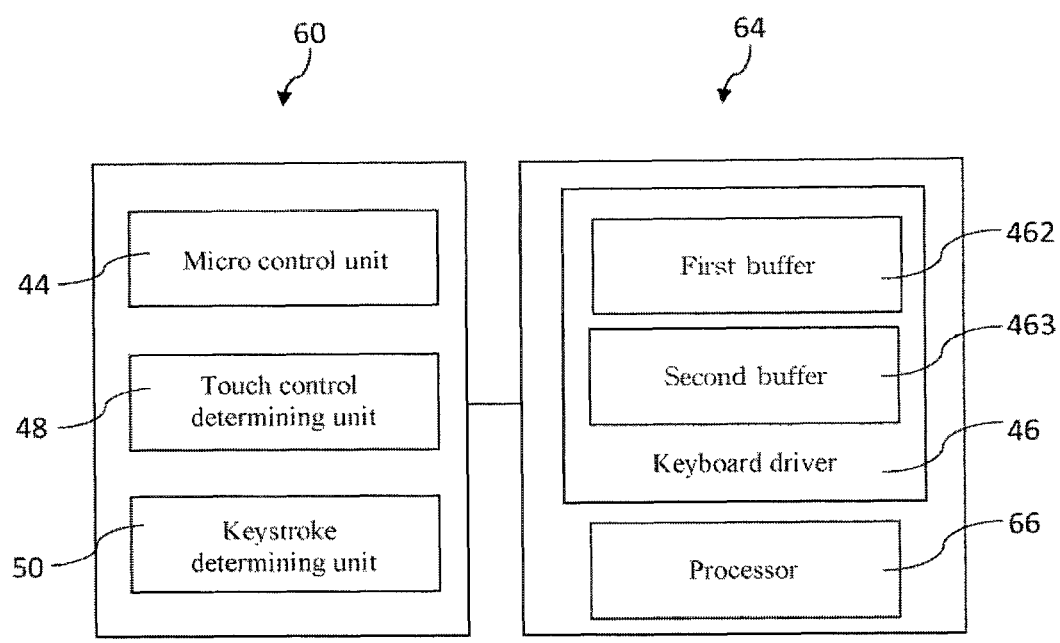
FIG. 15 is a systematic block diagram (2) of keyboard scanning circuit of the first, the second, and the third embodiment of the present invention and corresponding computing devices.

In some embodiments, as shown in FIG. 15, a difference between FIG. 15 and FIG. 14 is that the buffer 461 is replaced with two independent buffers: a first buffer 462 and a second buffer 463. That is, the first key signal and the second key signal are respectively stored in the first buffer 462 and the second buffer 463 which are used to distinguish data types in the first buffer 462 and the second buffer 463 when the processor 66 of the computing device 64 performs reading.

In some embodiments, after the first key signal is stored to its dedicated first buffer 462, the processor 66 of the computing device 64 is not notified in a manner of sending an interrupt request, but the processor 66 of the computing device 64 automatically reads the first buffer 462 dedicated to the first key signal in a polling manner at set intervals. Similarly, after the second key signal is stored to its dedicated second buffer 463, the processor 66 of the computing device 64 can automatically read the second buffer 463 dedicated to the second key signal in a polling manner at set intervals.

In some embodiments, the touch control determining unit 48 further includes a multiplexer 58 electrically connected to the capacitance detection circuit 55, so that all or a part of touch key parts 10 share the timer 54 and the capacitance detection circuit 55, and the timer 54 and the capacitance detection circuit 55 are not repeatedly disposed.

In some embodiments, wiring on the first circuit board 28, connected to the first conductive wire 30a and the second conductive wire 30b corresponding to each keycap 12a, 12b, or 12c uses a matrix architecture and detects values of coupling capacitors corresponding to the keycaps 12a, 12b or 12c in a row/column scanning manner, to improve efficiency of the pins utilization of the touch control determining unit 48. That is, by means of the matrix architecture, quantity of connections of the conductive wires between the touch control determining unit 48 and the touch key parts 10 on the keycaps 12a, 12b, or 12c can be dramatically reduced.

It should be noted that the embodiments of the present invention are not intended to limit all keys on the keyboard 18 according to components of the foregoing structure. If a part of keys do not need a touch function, a conventional structure of a common key may also be used. In addition, the touch key part 10 and the conductive distribution (that is, the first conductive bars 24a and 24c, the second conductive bars 24b and 24d, the first conductive walls 26a and 26c, and the second conductive walls 26b and 26d) may be made from highly conductive materials, such as Indium Tin Oxide (ITO), a highly conductive polymer, silver nanowires, a metal mesh, graphene, and carbon nanotubes.

In conclusion, the keyboard 18 provided in the embodiments of the present invention receives a first key signal generated after a touch and a second key signal generated after a keystroke by using the first circuit board 28 and the second circuit boards 36a and 36b, so that a user can operate in a keystroke manner and a touch manner by using physical keys of the same keyboard 18, avoiding troubles of respectively generating two types of key signals by using two different apparatuses.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:
1. A touch control keyboard, comprising:
a supporting plate;

a plurality of keycaps, wherein each keycap comprises a keycap column, a cap, and a touch key part, the keycap column is fixed to the cap, and the touch key part is disposed at a contact surface of the cap opposite to another side of the keycap column and has a coupling capacitor;

a plurality of supporting housings, wherein each supporting housing comprises a fixed end and an open end opposite to each other, and the fixed end is fixed to the supporting plate, wherein the keycap columns of the keycaps are respectively combined to the supporting housings;

a plurality pairs of conductive distributions, wherein each pair of conductive distribution is correspondingly disposed on the keycap and the supporting housing connected to each other and is electrically connected to a touch key part of the keycap;

a first circuit board, comprising a plurality pairs of conductive wires, wherein each pair of conductive wires is respectively disposed corresponding to the keycap, and each pair of conductive wires is electrically connected to the touch key part by means of the pair of conductive distributions, to detect the coupling capacitor to generate a first key signal; and a second circuit board, comprising a plurality of key contact points and a plurality of elastic components configured respectively corresponding to the key contact points, wherein each elastic component receives squeezing of the corresponding keycap column, so that the corresponding key contact point is stressed and changes from a normally open state to a conductive state to generate a second key signal.

2. The touch control keyboard according to claim 1, wherein each keycap further comprises a pair of conductive bars disposed at an outer surface of the keycap column, and the cap has two through holes, so that the touch key part is electrically connected to the pair of conductive bars respectively by means of the two through holes; and each supporting housing further comprises two conductive walls disposed at an inner wall of the open end of the supporting housings, and the two conductive walls are respectively electrically connected to the pair of conductive bars and respectively electrically connected to the pair of conductive wires of the first circuit board by running through the supporting plate and extending out of a bottom surface of the supporting plate, so that the pair of conductive bars and the two conductive walls form the conductive distributions.

3. The touch control keyboard according to claim 1, wherein the keyboard further comprises a keyboard scanning circuit, comprising:

a touch control determining unit, electrically connected to the conductive wires corresponding to the keycaps, to detect the coupling capacitors respectively by means of the conductive distributions to generate the first key signal; and a keystroke determining unit, electrically connected to the key contact points corresponding to the keycaps, to respectively detect the key contact points to change from the normally open state to the conductive state, to generate the second key signal.

4. The touch control keyboard according to claim 3, wherein the keyboard scanning circuit further comprises:

a micro control unit, storing the first key signal and the second key signal to a buffer of a computing device by using a keyboard driver, and sending an interrupt request to a processor of the computing device, so that the processor of the computing device reads the first key signal and the second key signal stored in the buffer.

5. The touch control keyboard according to claim 3, wherein the keyboard scanning circuit further comprises:

a micro control unit, storing the first key signal to a first buffer of the computing device by using a keyboard driver, and storing the second key signal to a second buffer of the computing device, so that a processor of the computing device reads the first key signal stored in the first buffer and the second key signal stored in the second buffer in a polling manner.

6. The touch control keyboard according to claim 3, wherein the touch control determining unit further comprises a capacitance detection circuit, configured to generate the first key signal when changes in values of the coupling capacitor exceed a threshold.

7. The touch control keyboard according to claim 3, wherein the touch control determining unit further comprises a multiplexer, so that all or a part of the touch key parts share the capacitance detection circuit.

8. The touch control keyboard according to claim 1, wherein wiring of the conductive wires connected to each corresponding keycap on the first circuit board uses a matrix architecture.

9. The touch control keyboard according to claim 1, wherein the touch key part and the conductive distribution are made from a highly conductive material and the highly conductive material is ITO (Indium Tin Oxide), a highly conductive polymer, silver nanowires, a metal mesh, graphene or carbon nanotubes.

10. The touch control keyboard according to claim 1, further comprising a plurality of covering layers respectively disposed on the touch key parts of the keycaps.

11. The touch control keyboard according to claim 1, wherein a side surface on the keycap neighboring to the touch key part is printed with letters, numbers, or symbol marks.

12. The touch control keyboard according to claim 1, wherein the first circuit board is integrated with the supporting plate, and each pair of conductive wires are disposed at another surface of the supporting plate opposite to the supporting housing.

* * * * *